US006867535B1

(12) United States Patent
Ladabaum

(10) Patent No.: US 6,867,535 B1
(45) Date of Patent: Mar. 15, 2005

(54) METHOD OF AND APPARATUS FOR WAFER-SCALE PACKAGING OF SURFACE MICROFABRICATED TRANSDUCERS

(75) Inventor: Igal Ladabaum, San Carlos, CA (US)

(73) Assignee: Sensant Corporation, San Leandro, CA (US)

( * ) Notice: Subject to any disclaimer, the term of this patent is extended or adjusted under 35 U.S.C. 154(b) by 452 days.

(21) Appl. No.: 09/435,324

(22) Filed: Nov. 5, 1999

(51) Int. Cl.[7] ................................................ H01L 41/08
(52) U.S. Cl. ....................................................... 310/334
(58) Field of Search ................................ 310/309, 311, 310/334, 335, 336, 337

(56) References Cited

U.S. PATENT DOCUMENTS 4,281,550 A * 8/1981 Erikson .................. 310/335 X
4,656,384 A * 4/1987 Magori ....................... 310/337
4,992,692 A * 2/1991 Dias ....................... 310/334 X
6,014,898 A * 1/2000 Finsterwald et al. ........ 310/334
6,049,159 A * 4/2000 Barthe et al. ............... 310/334

* cited by examiner

*Primary Examiner*—Mark O. Budd
(74) *Attorney, Agent, or Firm*—Pillsbury Winthrop LLP

(57) ABSTRACT

The present invention provides a method of packaging surface microfabricated transducers such that electrical connections, protection, and relevant environmental exposure are realized prior to their separation into discrete components. The packaging method also isolates elements of array transducers. Post processing of wafers consisting of transducers only on the top few microns of the wafer surface can be used to create a wafer scale packaging solution. By spinning or otherwise depositing polymeric and metallic thin and thick films, and by lithographically defining apertures and patterns on such films, transducers can be fully packaged prior to the final dicing steps that would separate the packaged transducers from each other. In the case of microfabricated ultrasonic transducers, such packaging layers can also enable flexible transducers and eliminate or curtail the acoustic cross-coupling that can occur between array elements.

24 Claims, 9 Drawing Sheets

METHOD OF AND APPARATUS FOR WAFER-SCALE PACKAGING OF SURFACE MICROFABRICATED TRANSDUCERS

BACKGROUND OF THE INVENTION

I. Field of the Invention

The present invention relates to the field of microfabricated transducers. More specifically, the present invention relates to microfabricated transducers formed on the, surface of a substrate and a method of packaging and isolating such transducers.

II. Description of the Related Art

Microfabricated transducers are devices made with the techniques of the semiconductor industry such as lithography, chemical vapor deposition, plasma etching, wet chemical etching and many others. These, devices contain structures capable of converting energy from the electrical domain to another physical domain. Examples of other physical domains include but are not limited to the acoustic, chemical, and optical domains. Transducers can also convert energy from said physical domains into an electrical signal. Surface microfabricated transducers describe a subset of microfabricated transducers that are formed on and whose entire function is contained within the surface portion of the supporting substrate, typically a silicon wafer. The surface portion is typically considered to represent up to 2% of the thickness of the substrate (0.1–10 microns for a typical 500 micron silicon wafer).

One example of a surface microfabricated transducer is the acoustic transducer disclosed in U.S. patent application Ser. No. 09/315,896 filed on May 20, 1999 entitled "ACOUSTIC TRANSDUCER AND METHOD OF MAKING THE SAME" and assigned to the same assignee as the present application. In operation, such a transducer, as shown in FIG. 1, can be used to generate an acoustic signal or to detect an acoustic signal. By generating electrical signals on the electrodes of the transducer, an electrostatic attraction between the electrodes 16 and 18 is caused. This attraction causes oscillation of the membrane 14, which, by thus moving, generates the acoustic signal. Similarly, an incoming acoustic signal will cause the membrane 14 to oscillate. This oscillation causes the distance between the two electrodes 16 and 18 to change, and there will be an associated change in the capacitance between the two electrodes 16 and 18. The motion of the membrane 14 and, therefore, the incoming acoustic signal can thus be detected. Arrays of acoustic transducers, whether integrated with electronics or not, are also known. In a typical acoustic transducer array, independent acoustic transducers are capable of being excited and interrogated at different phases, which enables the imaging functionality.

Because transducers convert energy between the electrical and another domain, they need to be in physical contact with the domain of interest. An acoustic transducer, for example, needs to be exposed to the medium in which it is to launch and receive acoustic waves. A chemical sensor measuring concentration, such as a humidity sensor, needs to be exposed to the environment in which it is trying to measure humidity. An optical sensor, measuring light, needs a transparent window to provide exposure to the optical environment. Thus, the packaging of microfabricated transducers must provide not only electrical connections and protection to the transducer, but also environmental exposure. Such complicated packaging can in many instances be more costly than the fabrication of the transducers themselves.

Therefore, a packaging methodology that takes advantage of the techniques used in transducer fabrication (sequences of film depositions, lithographic pattern definitions, and selective removal of film material) to reduce the cost of transducer packaging is highly desirable. Furthermore, in cases where many transducer elements are operated in an array configuration, such as in ultrasonic transducer arrays, droplet ejector arrays, etc, it may be desirable for the packaging to help isolate one element from the others. The packaging can help to mechanically or electrically isolate the elements. Further still, the packaging may be flexible, such as flex circuits known in the art, and in this manner enable flexible transducer arrays capable of adopting curved configurations.

It has recognized by the present inventor that the relatively flat topology of surface microfabricated devices allows them to be packaged with many of the techniques and materials of the printed circuit board industry. The present inventor has further recognized that in the specific case of microfabricated ultrasonic transducers, cross-coupling between array elements could be problematic. Cross-coupling can occur electrically or acoustically. While special precautions can be taken during transducer and substrate preparation to reduce or eliminate electrical and acoustic cross-coupling through the substrate, a particular interface wave known as the Stonely wave is responsible for much of the cross coupling observed in microfabricated ultrasonic transducer arrays. This wave propagates in parallel to the interface of two materials. Because microfabricated ultrasonic transducers tend to have a displacement component in this direction, as shown in FIGS. 2A and 2B, Stonely waves may be launched at the edges of array elements.

What is needed therefore, is a method of packaging surface microfabricated transducers which provides protection and electrical connections to the transducer, exposes the transducer to the medium of interest, and isolates the transducer from neighboring elements when relevant.

SUMMARY OF THE INVENTION

It is an object of the present invention to provide a method of packaging surface microfabricated transducers such that electrical connections, protection, and relevant environmental exposure are realized prior to the transducers' separation into discrete components.

It is an object of the present invention to provide a method of packaging surface microfabricated transducers such that array elements are isolated from each other.

It is an object of the present invention to provide a method of packaging arrays of surface microfabricated transducers such that the entire array is mechanically flexible.

It is an object of the present invention to provide a method of packaging surface microfabricated transducers and integrated circuitry such that the temperature they are exposed to during packaging harms neither the transducers nor the circuits.

It is an object of the present invention to provide an array of acoustic transducers isolated from each other such that acoustic waves coupling the elements cannot exist, and a method of packaging the same.

The present invention achieves the above objects, among others, by providing a method in which a packaging coating is applied to the surface of a transducer fabricated on a wafer. The packaging coating is typically a relatively thick coating, such as polymer. This packaging coating is etched, typically using a combination of lithographic patterning and chemical etching, to result in a plurality of walls, having exposed areas between the adjacent walls to allow for environmental contact with the transducers. After the packaging coating is applied and etched, the wafer can then be diced as necessary to provide discrete components, arrays, or flexible arrays.

In addition, it is possible, using additional deposition and lithography steps, to allow for interconnects to be located within the packaging coating. Further still, if the entire process uses a sufficiently low thermal budget, microfabricated transducers integrated with electronics can be packaged in the same manner.

BRIEF DESCRIPTION OF THE DRAWINGS

The features, objects and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
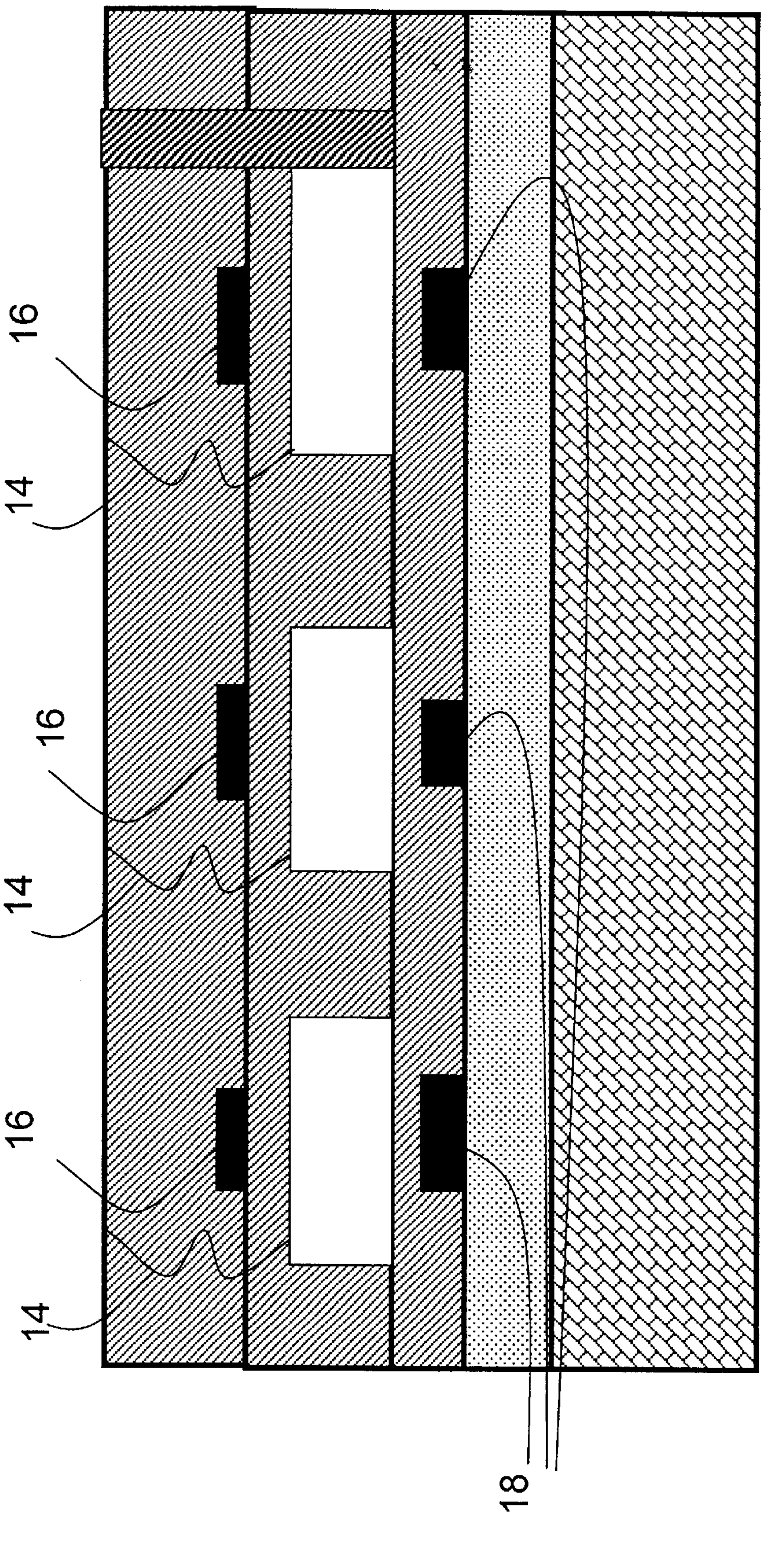
FIG. 1 illustrates a cross section of an acoustic transducer according to an embodiment of prior art.
Figure 2C:
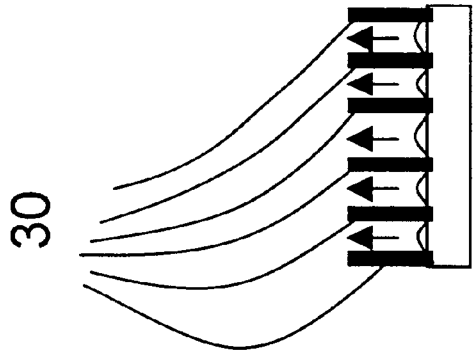
FIGS. 2A–C illustrate transducer motion, a Stonely wave that can result therefrom, and an embodiment that precludes the existence of the Stonely wave.
Figure 2B:
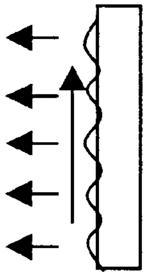
Figure 2A:
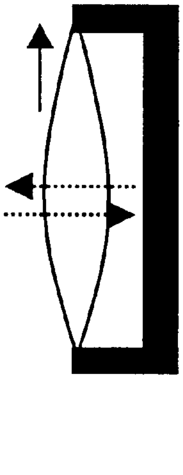

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention FIG. 2A illustrates a conceptual diagram of acoustic transducer motion. In particular, as shown, a transducer will resonate and cause motion in both the transverse direction as well as the lateral direction. FIG. 2B illustrates that the motion in the lateral direction will cause a laterally propagating acoustic wave, such as a Stonely wave, which laterally propagating wave can result in cross-coupling with other adjacent transducers. Accordingly, in order to prevent the propagation of the laterally propagating wave, the present invention implements a plurality of walls 30, such that transducers are isolated from laterally propagating waves of adjacent transducers. Accordingly, by preventing laterally propagating waves from traversing across transducers, cross-coupling that would otherwise occur can be prevented. Similarly, other types of transducers can use the same type of wall structure to isolate the medium being transmitted or sensed, as well to minimize the transmission of signals in the medium to adjacent transducers. Accordingly, for example, in the case of a light medium sensor, the wall structure 30 is sufficiently opaque to isolate adjacent transducers, and for a gas medium sensor, the wall structure 30 is sufficiently impermeable to the gases being sensed.

The process of packaging surface microfabricated transducers 20 in accordance with a preferred embodiment of the present invention will now be described with reference to FIGS. 4–9.

Figure 4:
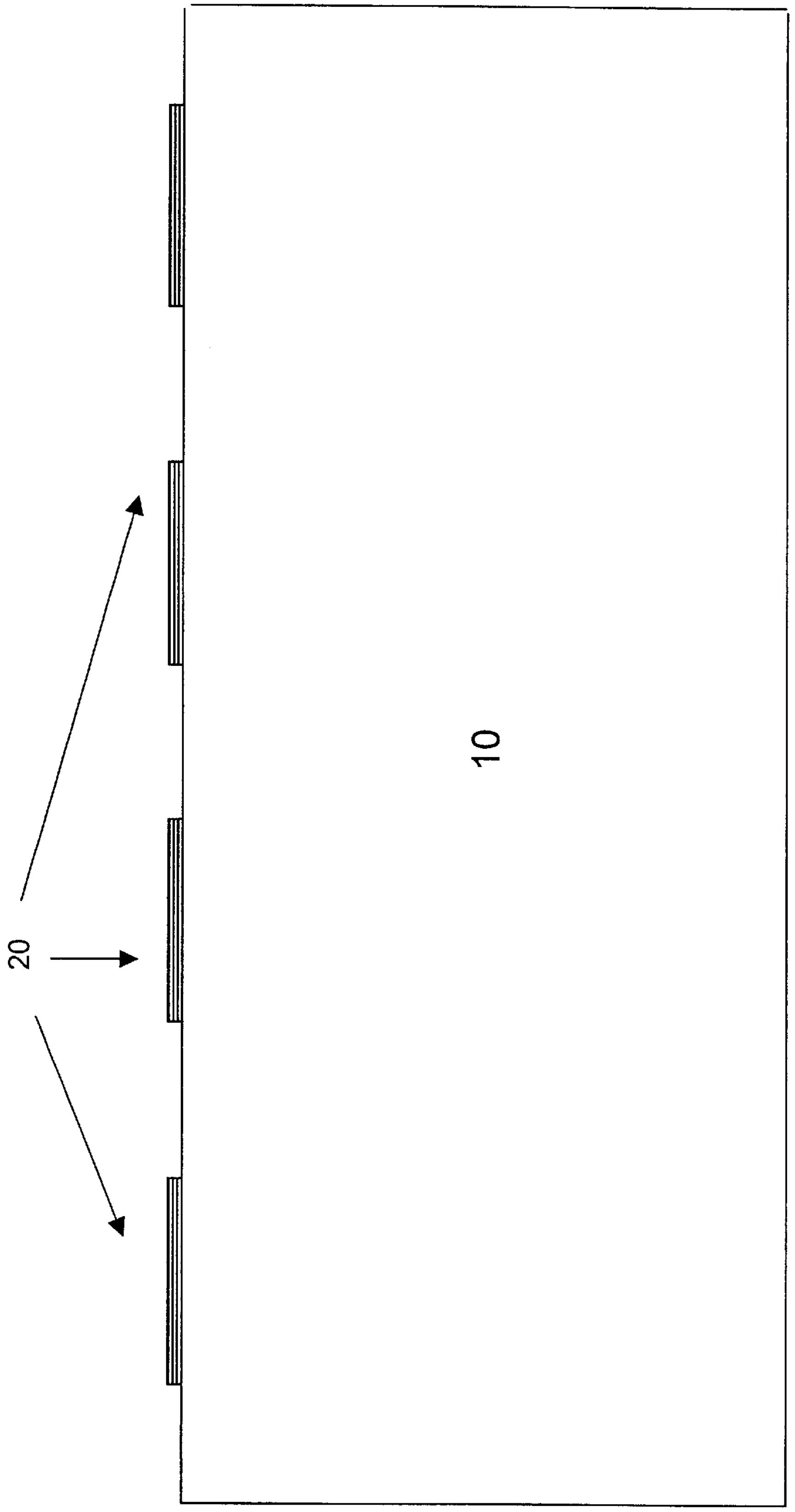
FIGS. 4–9 illustrate the process of packaging surface microfabricated transducers according to an embodiment of the present invention.

Starting with FIG. 4, the process begins with a silicon or other substrate 10, the surface of which contains microfabricated transducers 20 that have been fabricated using conventional processing such as thin film depositions, lithography, and etching. One aspect of the current invention is that the topology, which is the difference between the top and the bottom of the upper surface of surface microfabricated devices, or in other words the height of the surface microfabricated devices, preferably should not exceed 10 microns so that uniform polymer deposition is feasible. In the specific case of surface microfabricated ultrasonic transducers, the topology does not exceed 2 microns.

Figure 5:
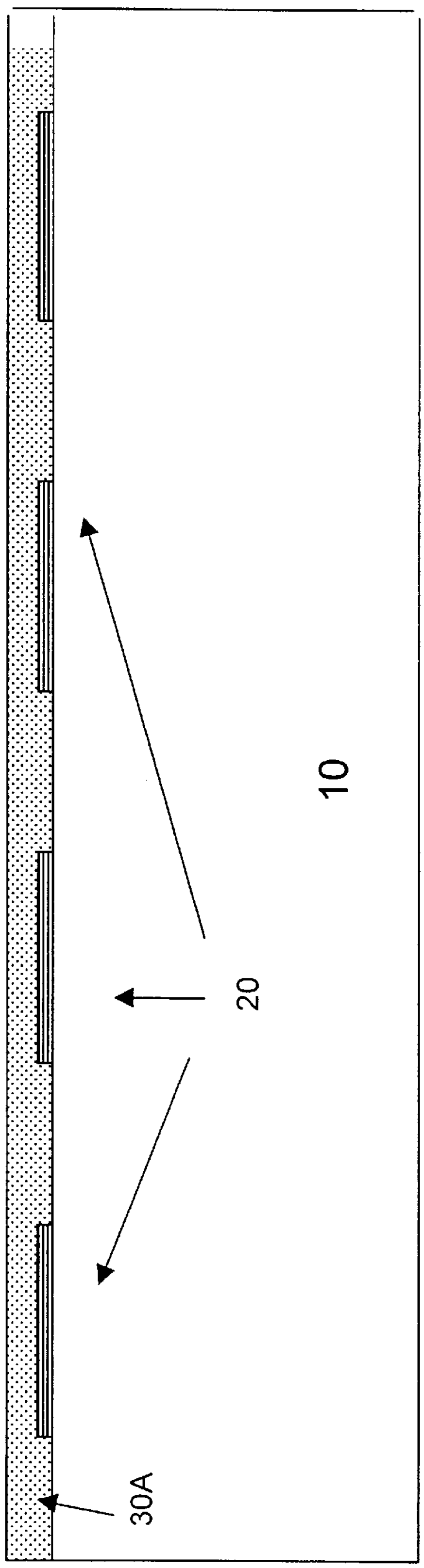

As shown in FIG. 5, there then is formed a layer 30A of polymeric material on the entire wafer and covering all transducers. This polymeric layer can be, by way of example only, polyester, polyimide, or silicone. Such a layer can be spun on, sprayed on, or otherwise applied to the surface of the wafer prior to polymer curing. The minimum thickness of the protective layer 30A is 2 microns, but typical dimensions are in the 10–100 micron range. An example of a commercially available, photosensitive polyimide well-suited for the task is Dupont PI 2611. Cure temperature of this compound is below 300 C, which ensures that the packaging process will not harm the sensors or any associated electronics.

Figure 6A:
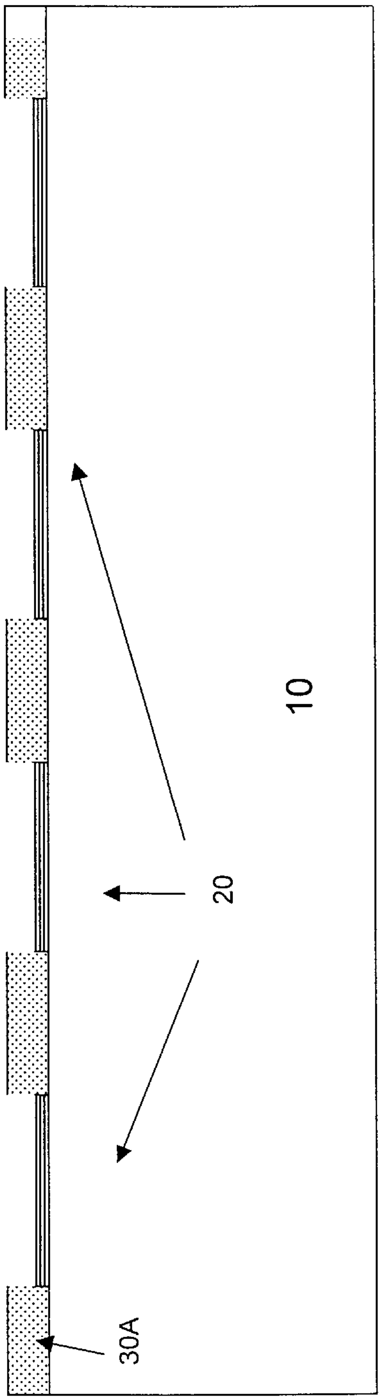
Figure 6B:
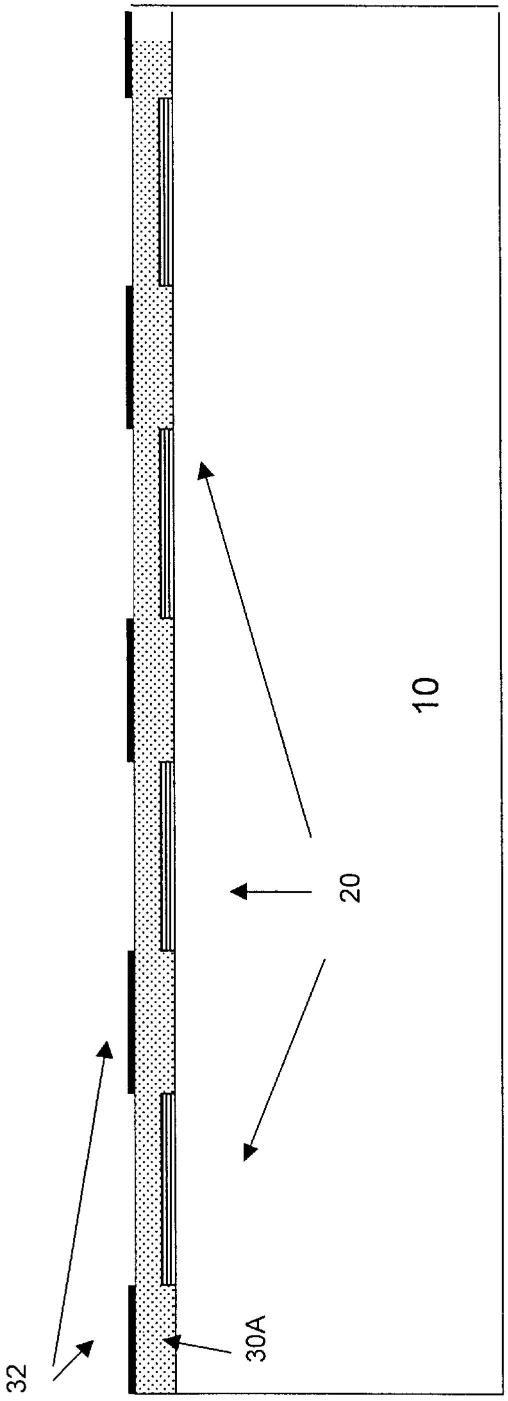

Thereafter, as shown in FIG. 6A, openings in polymeric layer 30A are made using photolithographic patterning. In the case of photosensitive coatings, such as Dupont PI 2611, exposure to ultraviolet radiation followed by development in an alkaline solution is sufficient. With other polymers, a masking step, illustrated in FIG. 6B, such as patterning a thin metallic layer 32 with a lift-off process known in the art, is necessary. This metallic layer serves as a mask during an oxygen plasma etch of the polymeric layer 30A. Layer 32 is necessary because photoresist is severely etched by an oxygen plasma but metals are not. The remaining portion of layer 32 can be removed with a metal etch chemistry (wet or dry), or simply remain as an artifact of fabrication.

Figure 7:
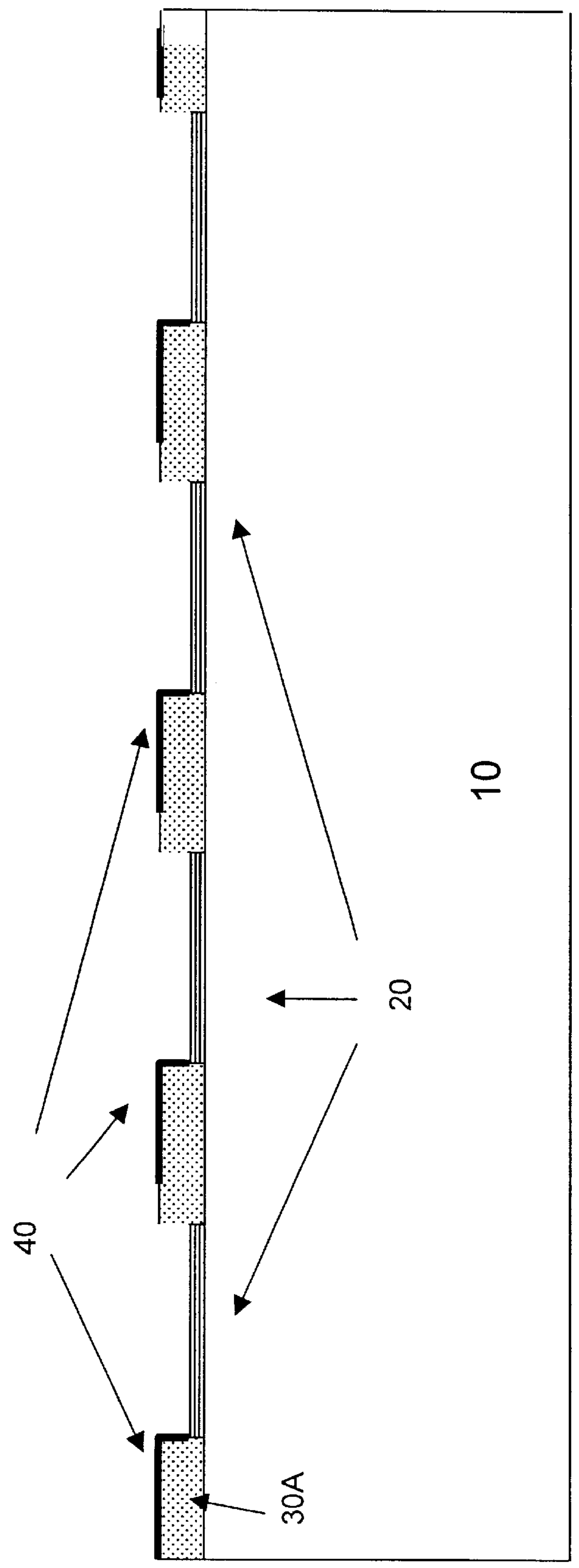

As shown in FIG. 7, thereafter follows the deposition of a conductor 40. This conductor may be, by way of example, sputtered or evaporated Aluminum, Gold, Platinum, or Nickel, with a thickness of at least 2500 Å. The conductor is patterned with a lift-off process known in the art, or some other suitable chemical etch that will not harm layer 30A. Alternately, the conductor can be directly printed as is known in the art. The purpose of the conductor is to carry electrical signals to and from the transducers. It connects to conductor pads designed as part of the transducers 20. The conductor may also serve as interconnects so that certain transducers can be connected together. The steps illustrated in FIGS. 5–7 can be repeated to generate multiple layers of conductors, if necessary.

Figure 8A:
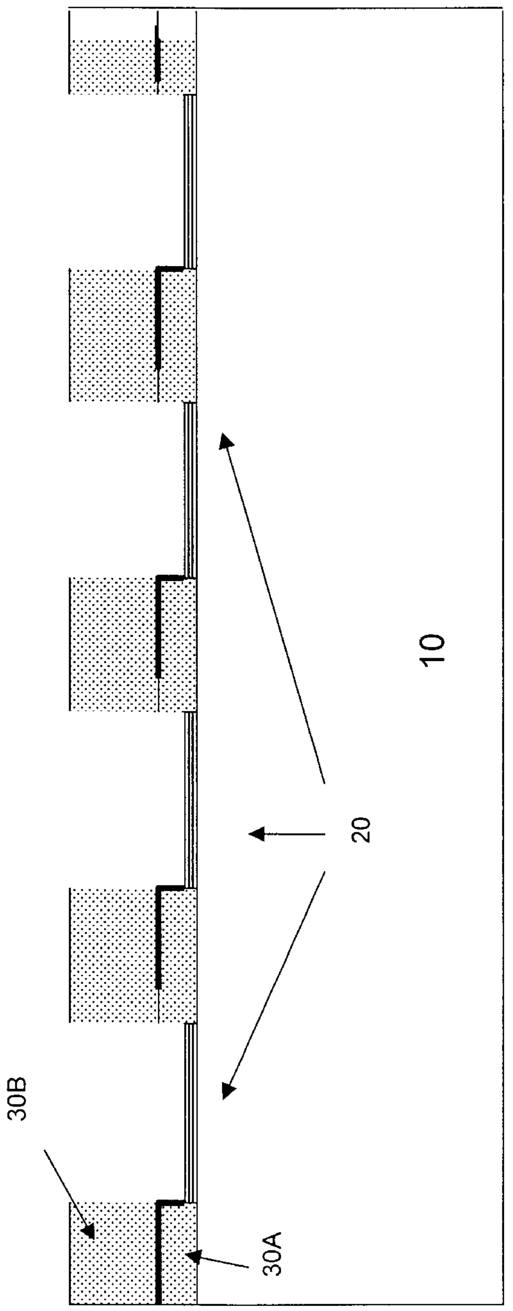
Figure 8B:
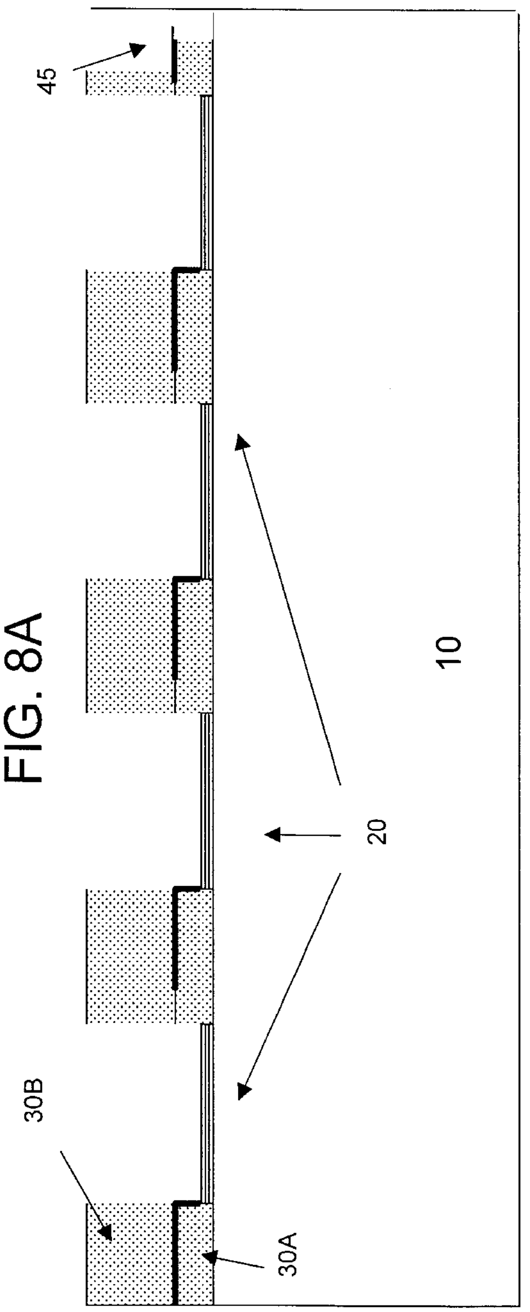

Thereafter, as shown with reference to FIG. 8A, final protective polymer layer 30B is formed on the entire wafer. The thickness of this layer will typically exceed 10 microns. As shown in FIG. 8B, layer 30B is patterned to expose the individual transducers 20, as well as to expose contact pads 45. These contact pads 45 will, once the devices are separated, host a wire bond or a solder bump, depending on which method is preferable in the final application. Accordingly, there results the walls 30 that will assist in reducing the ability of signals traveling from the specific transducer to adjacent transducers through the medium being sensed and which also serve to protect and package the specific transducer.

Another aspect of the present invention is the provision for packaging transducer arrays such that they are flexible.

Figure 9:
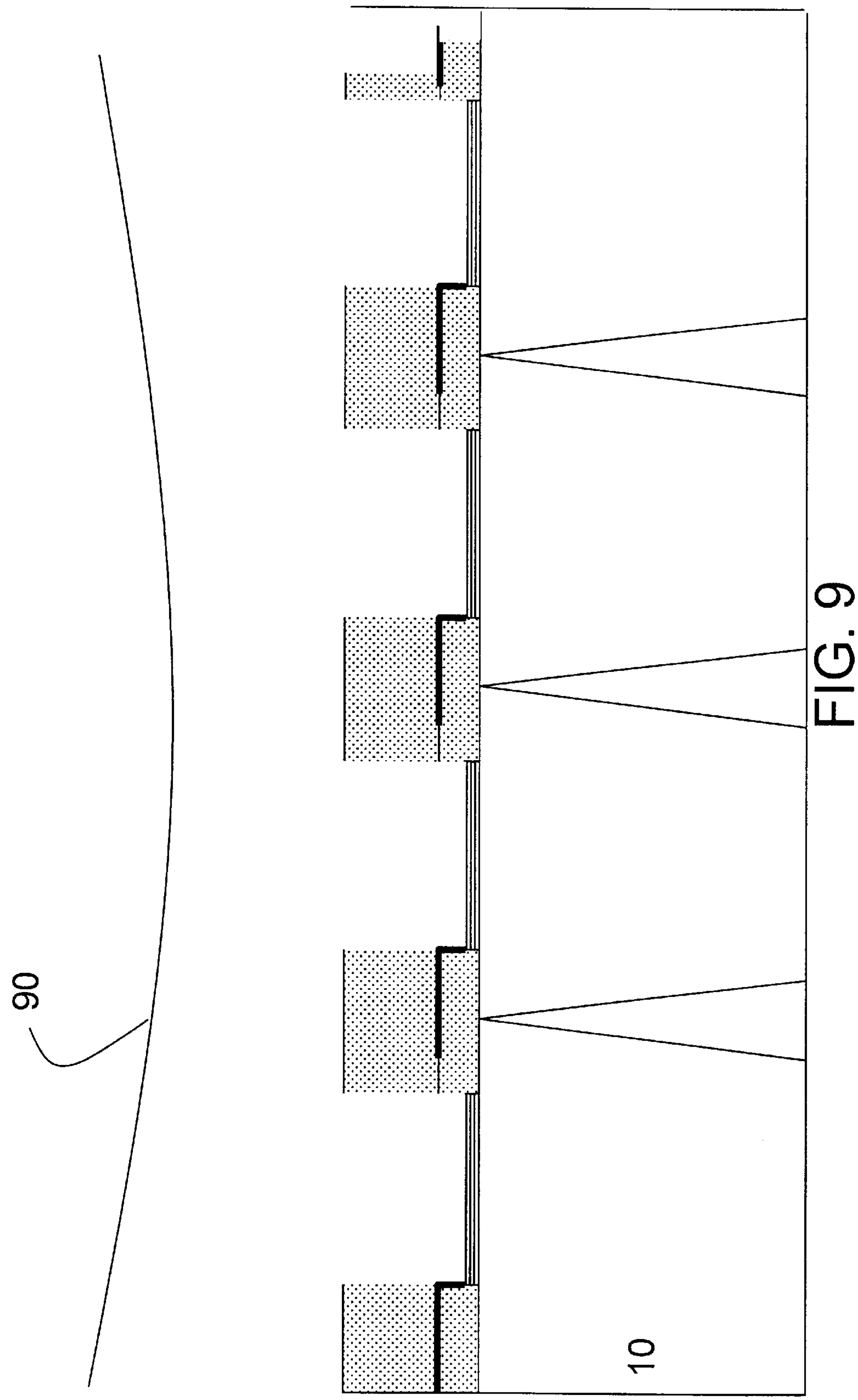

This can be achieved if polymer layers 30A and 30B are chosen such that they remain flexible after cure, as is known in the art of Flex Circuit manufacturing. As illustrated in FIG. 9, removal of portions 50 of the substrate 10 at the appropriate locations within what will become a single die will result in a flexible transducer array, as shown by curved line 90 that corresponds to the shape at which the flexible transducer array can take.

Figure 3B:
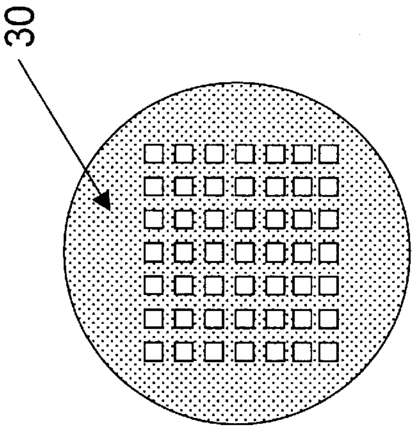
FIGS. 3A–C illustrate a top view and across section of transducers packaged with the method of the present invention.
Figure 3A:
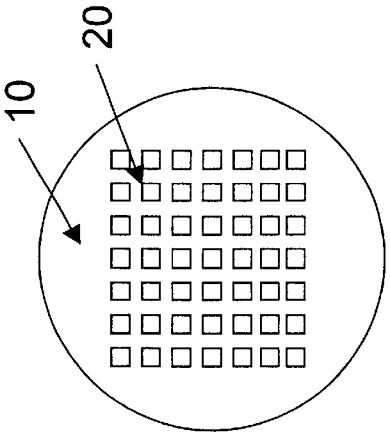
Figure 3C:
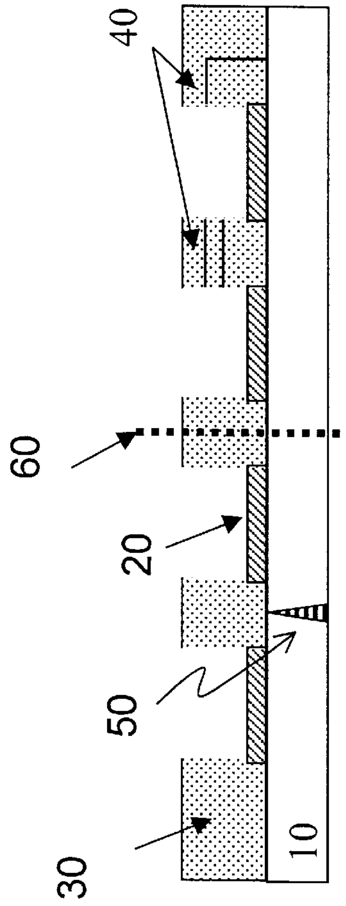

FIGS. 3B–3C illustrate the invention that results from the application of the layers described above to a wafer containing conventionally manufactured integrated circuit transducers. FIG. 3A illustrates a wafer containing conventionally manufactured integrated circuit transducers. FIG. 3B illustrates a top view of the invention and the packaging layer 30A that has been applied and etched, along with other layers as described. The cross section of FIG. 3*b* illustrates the walls 30 between individual transducers 20, and the preferential location 60 for cutting the wafer into die, that preferential location being between adjacent transducers 20 where there also exists a wall 30. Also shown are the interconnect lines 40 and the substrate cuts 50 that have been described previously. It should be noted that while the preferred embodiment contains a wall disposed between each transducer and the adjacent transducer, that there can be fewer walls. For example, there may be a wall between every other adjacent transducer, which will still have the affect of minimizing the transmission of signals in the medium. such as acoustic waves, but not to the same extent as the preferred embodiment.

While the present invention has been described herein with reference to particular embodiments thereof, a latitude of modification, various changes and substitutions are intended in the foregoing disclosure. Accordingly, it will be appreciated that in some instances some features of the invention will be employed without a corresponding use of other features without departing from the spirit and scope of the invention as set forth in the appended claims.

I claim:

1. A semiconductor transducer comprising:

an array of transducers all formed on a substrate; and a plurality of walls formed of an insulator between transducers on the array, each of the walls having a wall top surface that is above a top surface of the transducers so that the walls are capable of minimizing the transmission of the signals generated in or received by one of the transducers in the array to the other transducers in the array.

2. An apparatus according to claim 1 further including interconnects formed within the plurality of walls for providing electrical connection to the transducers in the array.

3. An apparatus according to claim 1 further including a cut on a substrate face opposite the walls to permit flexibility of the substrate.

4. An apparatus according to claim 2 further including a cut on a substrate face opposite the walls to permit flexibility of the substrate.

5. An apparatus according to claim 4 wherein the cut is located in alignment with one of the walls.

6. An apparatus according to claim 3 wherein the cut is located in alignment with one of the walls.

7. An apparatus according to claim 1 wherein the walls have a height greater than 2 microns.

8. An apparatus according to claim 2 wherein the walls have a height greater than 2 microns.

9. An apparatus according to claim 1 wherein the walls have a height within the range of 10–100 microns.

10. An apparatus according to claim 2 wherein the walls have a height within the range of 10–100 microns.

11. An apparatus according to claim 1 wherein the plurality of walls completely surround each of the transducers in the array.

12. An apparatus according to claim 2 wherein the plurality of walls completely surround each of the transducers in the array.

13. An apparatus comprising:

a substrate;

a plurality of transducers disposed in an array for sensing or transmitting signals in a medium surrounding the substrate; and means for minimizing the transmission of the signals sensed or transmitted by said transducers to adjacent transducers, the means for minimizing leaving the plurality of transducers exposed and having a wall top surface that is above a top surface of the transducers.

14. An apparatus according to claim 13 further including a cut on a substrate face opposite the means for minimizing to permit flexibility of the substrate.

15. An apparatus according to claim 13 wherein the means for minimizing are walls having a height greater than 2 microns.

16. An apparatus according to claim 13 wherein the means for minimizing are walls having a height within the range of 10–100 microns.

17. An apparatus according to claim 13 wherein the walls completely surround each of the transducers in the array.

18. An apparatus according to claim 14 wherein the walls completely surround each of the transducers in the array.

19. An apparatus according to claim 13 wherein the transducers have a height that does not exceed 10 microns.

20. An apparatus according to claim 14 wherein the transducers have a height that does not exceed 10 microns.

21. An apparatus according to claim 15, wherein the transducers have a height that does not exceed 10 microns.

22. An apparatus according to claim 16 wherein the transducers have a height that does not exceed 10 microns.

23. An apparatus according to claim 1 wherein each of the transducers in the array of transducers are surface microfabricated transducers.

24. An apparatus according to claim 13 wherein each of the transducers in the array of transducers are surface microfabricated transducers.

* * * * *